United States Patent [19]

Crouch

[11] 4,061,894

[45] Dec. 6, 1977

[54] VACUUM-TYPE CIRCUIT INTERRUPTER WITH IMPROVED PROTECTION FOR BELLOWS

[75] Inventor: Donald Wayne Crouch, Newtown Square, Pa.

[73] Assignee: General Electric Company, Philadelphia, Pa.

[21] Appl. No.: 681,008

[22] Filed: Apr. 28, 1976

[51] Int. Cl.[2] .......... H01L 33/66

[52] U.S. Cl. .......... 200/144 B

[58] Field of Search .......... 200/144 B; 313/217, 313/240

[56] References Cited

U.S. PATENT DOCUMENTS

| | | | |
|---|---|---|---|
| 2,897,322 | 7/1959 | Reece | 200/144 B |
| 2,900,476 | 8/1959 | Reece | 200/144 B |
| 2,920,169 | 1/1960 | Jennings | 200/144 B |
| 3,211,866 | 10/1965 | Crouch et al. | 200/144 B |
| 3,441,698 | 4/1969 | Sofianek | 200/144 B |
| 3,679,474 | 7/1972 | Rich | 313/217 |
| 3,766,345 | 10/1973 | Attia | 200/144 B |
| 3,854,068 | 12/1974 | Rich | 313/240 |

*Primary Examiner*—Robert S. Macon
*Attorney, Agent, or Firm*—William Freedman

[57] ABSTRACT

This vacuum-type circuit interrupter comprises a plate located at the outer side of one end cap of the evacuated envelope of the interrupter. Within the envelope there are separable beryllium contacts, one of which is carried by a movable contact rod extending through aligned apertures in the end cap and the plate. A flexible metal bellows extends freely through the aperture in the end cap and is joined at its outer end to the plate and at its inner end to the contact rod. A cup-shaped metal shield for the bellows comprises a tubular body portion surrounding the bellows and having a free-end region located within the aperture in the end cap during at least the final portion of an opening stroke of the movable contact rod. A metal shield within the envelope surrounds said tubular body portion in spaced relation and renders the region around said tubular body portion a region of very low electric stress.

6 Claims, 3 Drawing Figures

VACUUM-TYPE CIRCUIT INTERRUPTER WITH IMPROVED PROTECTION FOR BELLOWS

BACKGROUND

This invention relates to a vacuum-type circuit interrupter having contacts primarily of beryllium and, more particularly, relates to an interrupter of this type that has improved shielding means for preventing the formation of a damaging arc spot on the flexible metallic bellows of the interrupter during high current interruptions.

The usual vacuum interrupter comprises a flexible metal bellows disposed around the movable contact rod of the interrupter and providing a flexible seal around the rod that allows axial motion of the rod. Typically, this bellows extends into the envelope of the interrupter, and a guide is disposed within the bellows to guide the movable contact rod during its axial motion. The metal bellows typically has a thin wall exposed to the vacuum within the envelope, and it is most important that no arc spot be allowed to form on the exposed surface of this wall since such an arc spot can quickly burn a hole through the thin wall.

In conventional vacuum interrupters having copper-base contacts, this has not been a serious problem even during high current interruptions. There seems to be little tendency in such interrupters for arc spots to develop on the bellows, assuming a conventional shield is provided for the bellows. But with interrupters having contacts of beryllium, I have observed a much greater tendency for arc spots to form on the bellows. This may be due to the greater mobility of the arc-generated beryllium vapor as compared to that of copper.

SUMMARY

An object of my invention is to reduce the likelihood of an arc spot developing on the bellows of a beryllium-contact interrupter even during very high current interruptions.

Another object is to accomplish the object of the immediately-preceding paragraph in a compact interrupter having at least a portion of its bellows located within the envelope of the interrupter in a location relatively close to the contacts, where arcing occurs. Such a location for the bellows allows for effective guidance of the movable contact rod and also contributes to compactness of the interrupter.

Another object is to provide improve shielding means for the bellows of a beryllium-contact interrupter that effectively protects against arc-spot formation thereon.

In carrying out the invention in one form, we provide a vacuum interrupter comprising an evacuated envelope and separable contacts primarily of beryllium within the envelope. The envelope has a metal end cap containing an aperture through which a contact rod carrying one of the contacts freely extends. At the outer side of the end cap and joined thereto in spaced-apart, sealed relationship is a plate containing an opening through which the movable contact rod freely extends.

A flexible metal bellows of generally tubular form surrounds the contact rod and has its axially-inner end joined to the contact rod and its axially-outer end joined to said plate. The bellows extends freely through the aperture in the end cap. A cup-shaped metal shield for the bellows comprises an end wall joined to the contact rod near the inner end of the bellows and a tubular body portion projecting from the end wall and surrounding the bellows along a portion of the bellows length. The free-end region of said tubular body portion is located substantially within said aperture during at least the final portion of an opening stroke of the movable contact rod, with only a small clearance between said aperture and said free-end region.

A metal end shield is mounted on and electrically connected to the end cap and has a tubular portion surrounding the tubular portion of the cup-shaped shield. This tubular portion of the end shield is disposed between said cup-shaped shield and the main shield of the interrupter in radially-spaced relation to the main shield, thus making the region between the tubular portions of said cup-shaped shield and said end shield a region of very low electric stress.

BRIEF DESCRIPTION OF DRAWINGS

For a better understanding of the invention, reference may be had to the accompanying drawings, wherein.

DETAILED DESCRIPTION OF PREFERRED EMBODIMENT

Figure 1:
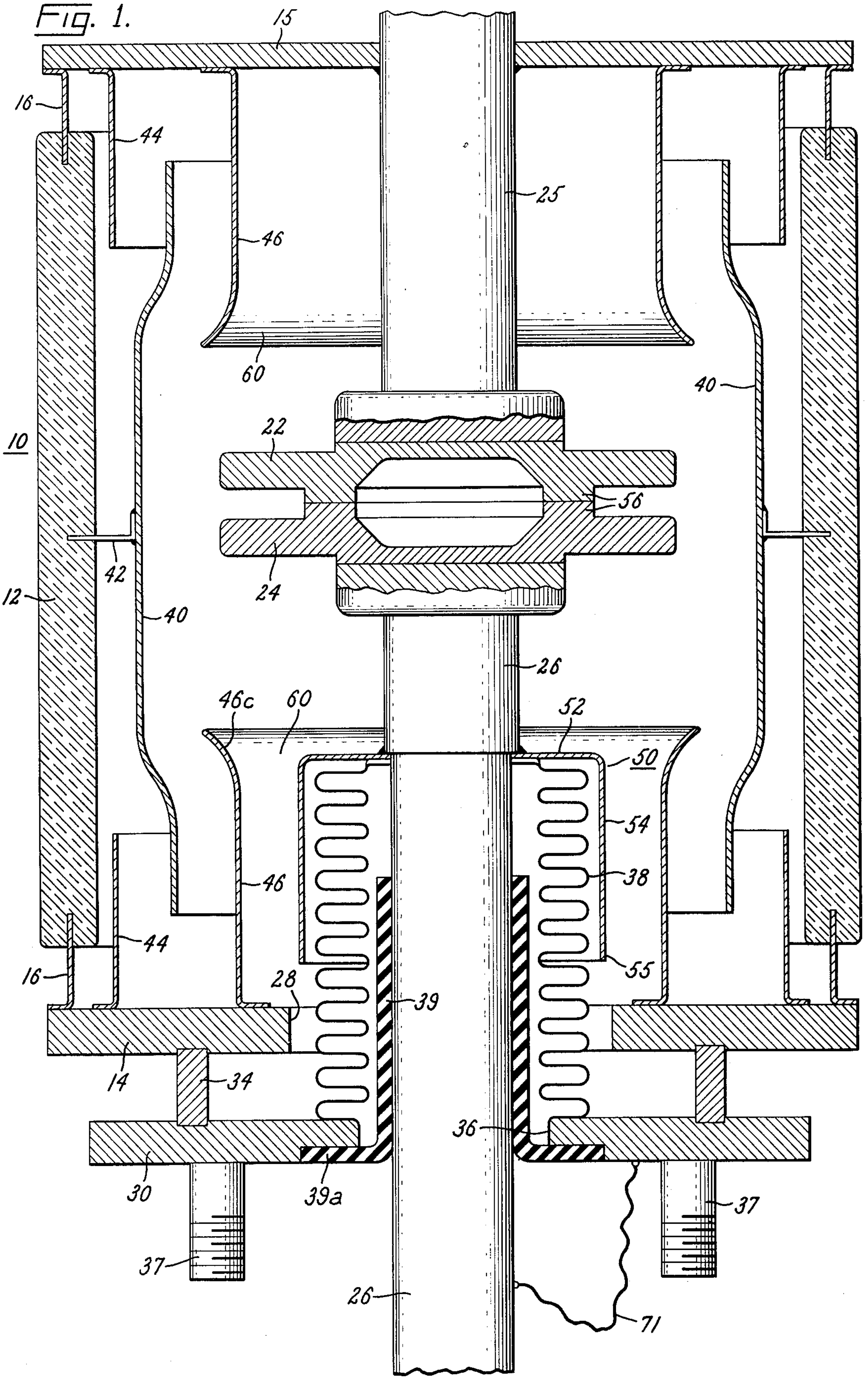
FIG. 1 is a side elevational view partly in section showing a vacuum interrupter embodying one form of the invention. The interrupter is shown in its closed position.

Referring now to FIG. 1, the interrupter shown therein comprises a highly evacuated envelope 10 comprising a tubular casing 12 primarily an insulating material and a pair of metal end caps 14 and 15 located at opposite ends of the casing and joined thereto by vacuum-tight seals 16.

Within envelope 10 are two separable contacts 22 and 24. Contact 22 is a stationary contact fixed to a stationary conductive contact rod 25 that extends in sealed relationship through the upper end cap 15. Contact 24 is a movable contact supported on the inner end of a movable contact rod 26 that extends freely through a centrally located aperture 28 in the lower end cap 14.

Located at the outer side of lower end cap 14 is a metal plate 30 which is joined to the end cap 14 in sealed relationship thereto by a metal ring 34 suitably brazed at its opposite ends to cap 14 and plate 30. Plate 30 is spaced from end cap 14 and contains a central opening 36 through which movable contact rod 26 freely extends. Suitable mounting studs 37 are provided on plate 30 to enable this plate to be attached independently of end cap 14 to a stationary support (not shown) for the interrupter.

For providing a seal about movable contact rod 26, a flexible metal bellows 38 is provided. This bellows is of a generally tubular form and surrounds contact rod 26. The axially inner end of bellows 38 is joined to contact rod 26 and its axially outer end is joined to plate 30. These joints at opposite ends of the bellows are brazed joints of a conventional vacuum-tight construction. Bellows 38 extends freely through aperture 28 in end cap 14.

Within bellows 38 is a tubular guide 39 that surrounds movable contact rod 26 and guides the movable contact rod in a substantially straight line vertical path during opening and closing of the interrupter. Guide 39 has a flange 39*a* on its lower end that is suitably fixed to plate 30.

Figure 2:
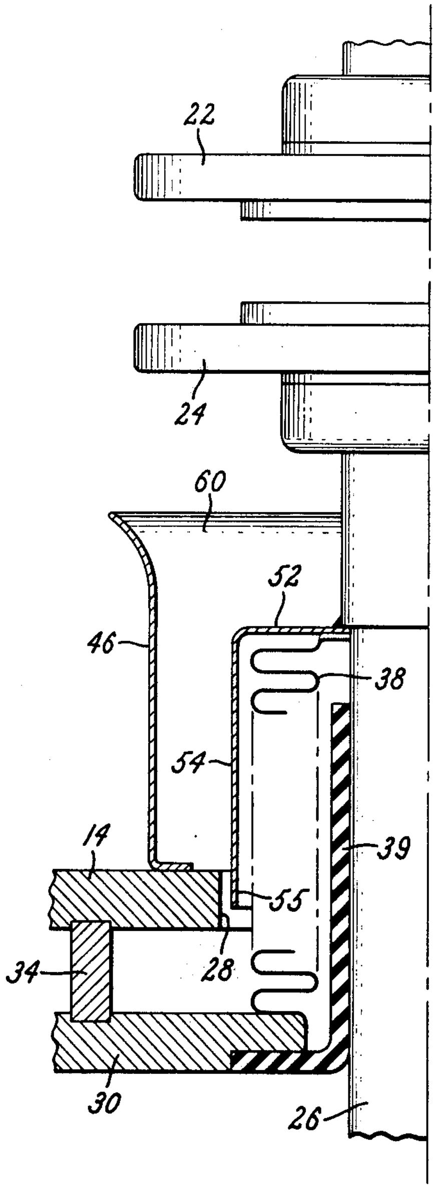
FIG. 2 shows a portion of the interrupter of FIG. 1 but shows the interrupter in its fully-open position.

Opening of the interrupter is effected by driving movable contact rod 26 in a downward direction from its position of FIG. 1 into its position of FIG. 2. This separates the contacts 22 and 24 and establishes an arcing gap therebetween across which an arc is drawn. Current flows through this arc until about the time of a natural current zero, at which time the arc vanishes and is prevented from reigniting by the high dielectric strength of the vacuum.

For condensing the metal vapors generated by the high current arc, a tubular metal main shield 40 is provided about the arcing gap. This shield is normally electrically isolated from both contacts 22 and 24. It has a radially-outwardly extending mounting flange 42 that is suitably supported on casing 12. Metal vapors emitted from the arcing gap by the arc are intercepted and condensed by shield 40, and this aids the interrupter in recovering its dielectric strength at a current zero as well as protecting the insulating casing from being coated with metal particles deposited from the metal vapors.

Surrounding the main shield 40 at its respective opposite ends are end shields 44 of the general type shown in U.S. Pat. No. 3,441,698-Sofianek, assigned to the assignee of the present invention. These end shields 44 are electrically connected to the end caps 15 and 14, respectively, and therefore are at the same potential as contacts 22 and 24, respectively. Each of these end shields is of a generally tubular form and surrounds the end of main shield 40 in radially-spaced relation. These end shields serve to intercept and condense metal vapors that might bypass the main shield 40 at its ends. The end shields 44 also serve to relieve the seals 16 of voltage stresses at their inner ends.

Located radially inwardly of main shield 40 at its opposite ends are additional end shields 46. These additional shields 46 are of a tubular form and are electrically connected to the end caps 14 and 15 respectively. Thus, the upper end shield 46 is at the same potential as upper contact 22, and the lower end shield 46 is at the same potential as lower contact 24.

For protecting bellows 38 from the arc-generated metal vapors, a cup-shaped metal shield 50 is provided. Shield 50 comprises an end wall 52 joined to movable contact rod 26 near the inner end of the bellows and a tubular body portion 54 projecting from end wall 52 and surrounding the bellows along a portion of its length. In the embodiment of FIG. 1, when the interrupter is closed, the free-end region 55 of tubular body portion 54 is spaced slightly from the aperture 28 in end cap 14. But when the movable contact rod 26 is driven downwardly during an opening operation, this free-end region 55 enters the aperture 28, as shown in FIG. 2. There is then only a small radial clearance between aperture 28 and the free-end region 55.

Contacts 22 and 24 are preferably of the general configuration shown in the aforesaid Sofianek U.S. Pat. No. 3,441,698. In this respect, each contains a plurality of circumferentially-spaced slots (not shown) extending from the outer periphery of the contacts to a point near the contact-making region 56. These slots encourage the arc formed between the contacts to revolve about the center of the contact, thereby reducing the quantity of vapors generated by the arc.

Most of the arc-generated metal vapors are projected radially outward from the arcing gap and are condensed on the inner surface of main shield 40. But a substantial quantity of the metal vapors is also projected from the gap through the above-mentioned slots in the contacts in directions longitudinal of insulating casing 12. A high percentage of these latter vapors are trapped within the spaces 60 surrounded by the two end shields 46, condensing on the metal surfaces immediately bordering said spaces 60. This trapping and condensation helps to prevent the vapors from finding paths around the ends of the main shield 40.

The vacuum interrupter disclosed herein is rated to interrupt very high currents, e.g., 50,000 amperes r.m.s. Applicant was called upon to meet this current-interrupting rating with an interrupter having an envelope of a size not appreciably greater than that used in the interrupter of the aforesaid Sofianek patent for interrupting currents of about 3/5 this value. A first step in solving this problem was to make the contacts 22, 24 of beryllium instead of the copper-base material heretofore used in the interrupter of the Sofianek patent in view of the known higher current-interrupting capacity of beryllium.

It was found, however, that when beryllium was used for the contacts of the interrupter of the Sofianek patent, there was a marked tendency for arc spots to develop on the bellows of the interrupter during high-current interrupting operations, something which was rarely, if ever, experienced with copper-base contacts in this particular interrupter. Such arc spots must be avoided since they can quickly burn a hole in the thin wall of the bellows and cause the interrupter to fail during an interrupting operation. It is believed that this increased tendency to form arc spots on the bellows is related to the greater mobility of the very light beryllium vapors as compared to that of vapors of copper and other conventional contact materials and to the higher arc voltage of beryllium as compared to copper.

I have constructed the illustrated interrupter in such a way as to effectively prevent the formation of arc spots on the bellows, even when using beryllium contacts for interrupting high currents. In this respect, note that the lower end of the bellows 38 is extended through an aperture 28 in the end cap 14 and joined to an additional plate 30 located beneath and spaced from the end cap. Note also that the free end 55 of the cup shaped shield 50 is only slightly spaced from the aperture 28 when the interrupter is closed and enters the aperture during an opening operation. Radial clearance between the free end and the aperture 28 is preferably made as small as possible consistent with the requirement that there be no rubbing between these parts. The guide 39 maintains the desired clearance, with some slight tolerance in this clearance being required for minor manufacturing variations.

The entry of the free end of the bellows shield into aperture 28 and the smallness of the clearance between the parts coact in several significant ways. First, these features serve to limit the amount of beryllium vapor that can reach the exposed surface of the bellows beneath the free end 55 of the cup-shaped shield 50, and, secondly, these features even further reduce the voltage stresses at the bellows surface. It appears that a combination of beryllium vapor and voltage stress at the bellows surface is responsible for arc-spot formation on the bellows, and I severely limit both these conditions by virtue of the above features and their coaction.

Another factor contributing to a very low electrical stress adjacent the bellows is the presence of the auxiliary end shield 46 surrounding the bellows shield 50. Since this auxiliary end shield 46 is at the same potential as the bellows 38 and the bellows shield 50 and is interposed between the main shield 40 and the bellows, there is only a low electrical stress in the space 60 bounded by auxiliary end shield 46. The presence of the bellows shield 50 and its above-described interfitting relationship with aperture 28 further reduces the electrical stress in the region immediately adjacent the bellows.

It is to be noted that although I leave only a very small clearance between the free end of the bellows shield 50 and the end cap 14, a relatively large clearance is left between the bellows shield 50 and the surrounding auxiliary end shield 46, thus allowing a substantial quantity of the arc-generated vapors to enter space 60 between these parts for trapping and condensation in a low stress region. The outward flare at the upper end 46c of the lower auxiliary end shield 46 contributes to increased accessibility of space 60 to the arc-generated vapors.

It is noted that smaller clearances can be provided between relatively movable parts in a vacuum interrupter with beryllium contacts than in one with copper-base contacts, assuming such clearance space is in a region where arcing products might enter. This is the case because the arc-generated beryllium particles are very fine and substantially free of relatively large globules such as present in the arc-generated copper vapor. There is thus much less likelihood that a large globule will be deposited in the clearance space to produce friction and galling between the relatively movable parts. Hence, I can make the clearance between the aperture 28 and the free end 55 of the bellows shield smaller in my beryllium-contact interrupter than in an interrupter with contacts of copper-base material.

I am aware that the amount of vapor reaching the region of the bellows can be reduced if the bellows is shifted to a location remote from the arcing regions, but for several reasons it is usually not practical to so locate the bellows. First of all, if the bellows is located in a remote region, its presence adds to the length of the interrupter, thus interfering with attaining the desired compactness. Secondly, if the bellows is in a region remote from the contacts, any guide located within the bellows (such as my guide 39) looses much of its effectiveness in guiding the movable contact for proper mating with the stationary contact. For maximum effectiveness, the guide should be as close as possible to the movable contact and should also be outside of the evacuated space.

I have located my bellows in proximity to the contacts and have thus attained the desired compactness and effective guidance of the movable contact; but despite this proximity, I am able to protect the bellows from arc-spot formation, as has been explained hereinabove.

In a preferred embodiment of the invention, the bellows shield 50 is made of stainless steel. The use of stainless steel instead of copper for this part results in a shield that is less susceptible to undesired deformation, thus enabling me to maintain the desired small clearance between aperture 28 and the free end 55 of the shield with less risk of rubbing or interference. Preferably, the other shields 46, 44, and 40 are also of stainless steel.

Figure 3:
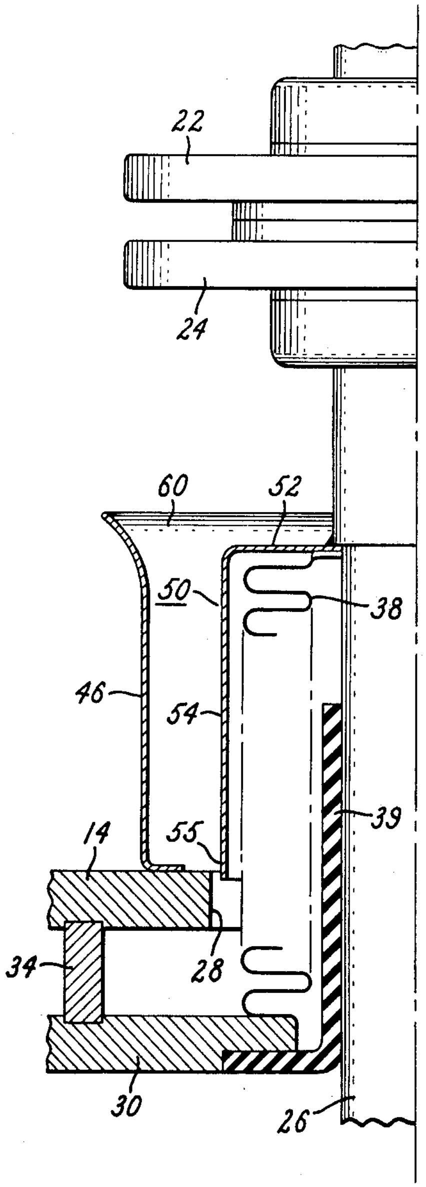
FIG. 3 shows a modified embodiment of the invention. The interrupter of FIG. 3 is shown in its closed position.

FIG. 3 illustrates another embodiment of my invention. This embodiment is the same as that of FIGS. 1 and 2 except that the free-end region 55 of the cup-shaped bellows shield 50 is always positioned within aperture 28, even when the interrupter is closed. This relationship further reduces the chance for beryllium vapor reaching the bellows and inducing the formation of an arc spot on the bellows. A minor disadvantage of this design is that it requires a slightly longer cup-shaped shield 50.

In both embodiments of the invention, I provide one or more sections of flexible conductive braid (such as shown at 71 in FIG. 1) connected electrically between the mounting plate 30 and the movable contact rod 26. This braid provides a low resistance shunt path around the bellows 38 and thus effectively prevents any significant amount of current from flowing through the bellows.

While I have shown and described a particular embodiment of my invention, it will be obvious to those skilled in the art that various changes and modifications may be made without departing from my invention in its broader aspects; and I, therefore, intend herein to cover all such changes and modifications as fall within the true spirit and scope of my invention.

What I claim as new and desire to secure by Letters Patent of the United States is:

1. A vacuum-type circuit interrupter comprising:
   - a. a highly-evacuated envelope comprising a tubular casing of insulating material and a metal end cap that contains an aperture and is joined in sealed relationship to said casing at one end of said casing,
   - b. separable contacts primarily of beryllium located within said envelope,
   - c. a movable conductive contact rod extending freely through said aperture in said end cap and carrying one of said contacts at one end thereof,
   - d. a plate located at the outer side of said end cap and joined to said end cap in sealed relationship thereto, said plate being spaced from said end cap and containing an opening through which said movable contact rod freely extends,
   - e. a flexible metal bellows of generally tubular form surrounding said contact rod and having its axially-inner end joined to said contact rod and its axially-outer end joined to said plate, said bellows extending freely through said aperture in said end cap,
   - f. a cup-shaped metal shield for said bellows comprising:
     - $f_1$. an end wall joined to said contact rod near said inner end of the bellows, and
     - $f_2$. a tubular body portion projecting from said end wall and surrounding said bellows along a portion of the bellows length, the free-end region of said tubular body portion being located substantially within said aperture during at least the final portion of an opening stroke of the movable contact rod, with only a small clearance between said aperture and said free-end region,
   - g. a metal main shield within said casing, surrounding said contacts, and normally electrically isolated from said contacts for condensing beryllium vapors generated by arcing between said contacts, said main shield having an end portion surrounding said cup-shaped bellows shield,
   - h. a metal end shield mounted on said end cap and electrically connected thereto, said end shield having a tubular portion surrounding the tubular portion of said cup-shaped shield and disposed between said tubular portion of the cup-shaped shield and the end portion of said main shield in radially-spaced relation to said end portion, the region between the tubular portions of said cup-shaped shield and said end shield being a region of very low electric stress.

2. The interrupter of claim 1 in which said free-end region of said tubular body portion is located adjacent to but outside said aperture when said interrupter is closed.

3. The interrupter of claim 1 in which said free-end region of said tubular body portion is located within said aperture when said interrupter is closed.

4. An interrupter as defined in claim 1 and further comprising an additional end shield mounted on said end cap and electrically connected thereto, said additional end shield having a tubular portion surrounding the end portion of said main shield and radially spaced therefrom.

5. An interrupter as defined in claim 1 in which said cup-shaped shield is of stainless steel.

6. The interrupter of claim 1 in combination with fastening means on said plate for attachment of the plate to a support independently of said end cap so that said plate can serve as a mounting for the interrupter.

* * * * *